United States Patent
Khlat

(10) Patent No.: US 11,482,970 B2
(45) Date of Patent: Oct. 25, 2022

(54) POWER MANAGEMENT CIRCUIT OPERABLE TO ADJUST VOLTAGE WITHIN A DEFINED INTERVAL(S)

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 17/315,652

(22) Filed: May 10, 2021

(65) Prior Publication Data

US 2022/0066487 A1 Mar. 3, 2022

Related U.S. Application Data

(60) Provisional application No. 63/073,960, filed on Sep. 3, 2020.

(51) Int. Cl.
*H03F 1/02* (2006.01)
*G05F 1/46* (2006.01)

(52) U.S. Cl.
CPC ............ *H03F 1/025* (2013.01); *G05F 1/46* (2013.01)

(58) Field of Classification Search
None
See application file for complete search history.

(56) References Cited

U.S. PATENT DOCUMENTS

| 8,159,309 | B1 | 4/2012 | Khlat et al. |
| 8,718,188 | B2 * | 5/2014 | Balteanu ............ H03F 1/02 375/297 |
| 8,912,769 | B2 | 12/2014 | Lin et al. |
| 9,020,453 | B2 * | 4/2015 | Briffa ............ H04B 1/0475 455/102 |
| 9,069,365 | B2 | 6/2015 | Brown et al. |
| 9,148,090 | B2 | 9/2015 | Tsuji |

(Continued)

FOREIGN PATENT DOCUMENTS

WO 2018187245 A1 10/2018

OTHER PUBLICATIONS

U.S. Appl. No. 17/182,539, filed Feb. 23, 2021.

(Continued)

*Primary Examiner* — Thomas J. Hiltunen
(74) *Attorney, Agent, or Firm* — Withrow & Terranova, P.L.L.C.

(57) ABSTRACT

A power management circuit operable to adjust voltage within a defined interval(s) is provided. The power management circuit is configured to generate a time-variant voltage for amplifying an analog signal based on a target voltage. In embodiments disclosed herein, the power management circuit can be configured to generate a lower initial target voltage at a start of the defined interval(s), such as during a cyclic prefix (CP) of an orthogonal frequency division multiplexing (OFDM) symbol, and dynamically adjust the initial target voltage, if necessary, within the defined interval(s) based on a time-variant power envelope of the analog signal. By generating the lower target voltage, in contrast to a conventional method of generating a maximum target voltage, at the start of the defined interval(s), it is possible to reduce energy waste and help improve efficiency in a power amplifier configured to amplify the analog signal based on the time-variant voltage.

18 Claims, 7 Drawing Sheets

(56) References Cited

U.S. PATENT DOCUMENTS

| | | | |
|---|---|---|---|
| 9,172,331 B2 * | 10/2015 | Nagasaku | H03F 3/3016 |
| 9,231,527 B2 * | 1/2016 | Hur | H03F 1/0288 |
| 9,350,299 B2 | 5/2016 | Tsuji | |
| 9,391,567 B2 * | 7/2016 | Kaczman | H03F 3/245 |
| 9,407,476 B2 | 8/2016 | Lim et al. | |
| 9,496,828 B2 * | 11/2016 | Ye | H03F 1/025 |
| 9,614,477 B1 | 4/2017 | Rozenblit et al. | |
| 9,634,560 B2 | 4/2017 | Ek | |
| 10,097,145 B1 | 10/2018 | Khlat et al. | |
| 10,142,074 B2 * | 11/2018 | Wang | H04L 27/2613 |
| 10,243,524 B2 * | 3/2019 | Orr | H02M 3/1582 |
| 10,778,094 B2 * | 9/2020 | de Cremoux | H03G 3/3089 |
| 10,862,428 B2 * | 12/2020 | Henzler | H03F 3/21 |
| 11,223,325 B2 * | 1/2022 | Drogi | H03F 3/195 |
| 2003/0099230 A1 | 5/2003 | Wenk | |
| 2004/0179382 A1 | 9/2004 | Thaker et al. | |
| 2014/0312710 A1 * | 10/2014 | Li | H02M 3/07 |
| | | | 307/112 |
| 2016/0294587 A1 | 10/2016 | Jiang et al. | |
| 2018/0234011 A1 | 8/2018 | Muramatsu et al. | |
| 2018/0257496 A1 | 9/2018 | Andoh et al. | |
| 2018/0278213 A1 | 9/2018 | Henzler et al. | |
| 2018/0351454 A1 | 12/2018 | Khesbak et al. | |
| 2019/0109566 A1 | 4/2019 | Folkmann et al. | |
| 2019/0334750 A1 * | 10/2019 | Nomiyama | H03F 1/025 |
| 2020/0336105 A1 | 10/2020 | Khlat | |
| 2020/0336111 A1 | 10/2020 | Khlat | |
| 2021/0175798 A1 | 6/2021 | Liang | |
| 2021/0257971 A1 | 8/2021 | Kim et al. | |
| 2022/0069788 A1 | 3/2022 | King et al. | |

OTHER PUBLICATIONS

U.S. Appl. No. 17/217,594, filed Mar. 30, 2021.
U.S. Appl. No. 17/217,654, filed Mar. 30, 2021.
U.S. Appl. No. 17/316,828, filed May 11, 2021.
U.S. Appl. No. 17/237,244, filed Apr. 22, 2021.
U.S. Appl. No. 17/218,904, filed Mar. 31, 2021.
U.S. Appl. No. 17/325,482, filed May 20, 2021.
Mellon, L., "Data Transmission—Parallel vs Serial," Jul. 10, 2017, https://www.quantil.com/content-delivery-insights/content-acceleration/data-transmission/, 4 pages.
Non-Final Office Action for U.S. Appl. No. 17/237,244, dated Sep. 20, 2021, 14 pages.
Non-Final Office Action for U.S. Appl. No. 17/325,482, dated Sep. 30, 2021, 10 pages.
Notice of Allowance for U.S. Appl. No. 17/237,244, dated Jan. 27, 2022, 8 pages.
Non-Final Office Action for U.S. Appl. No. 17/325,482, dated Mar. 15, 2022, 10 pages.
International Search Report and Written Opinion for International Patent Application No. PCT/US2021/061721, dated Mar. 14, 2022, 13 pages.
Non-Final Office Action for U.S. Appl. No. 17/217,654, dated Jul. 1, 2022, 9 pages.
Non-Final Office Action for U.S. Appl. No. 17/218,904, dated May 25, 2022, 14 pages.
Notice of Allowance for U.S. Appl. No. 17/218,904, dated Aug. 26, 2022, 9 pages.
Final Office Action for U.S. Appl. No. 17/325,482, dated Aug. 16, 2022, 12 pages.
Non-Final Office Action for U.S. Appl. No. 17/408,899, dated Aug. 29, 2022, 13 pages.

* cited by examiner

POWER MANAGEMENT CIRCUIT OPERABLE TO ADJUST VOLTAGE WITHIN A DEFINED INTERVAL(S)

RELATED APPLICATIONS

This application claims the benefit of U.S. Provisional Patent Application Ser. No. 63/073,960 filed on Sep. 3, 2020, which is incorporated herein by reference in its entirety.

FIELD OF THE DISCLOSURE

The technology of the disclosure relates generally to a power management circuit generating a time-variant voltage for signal amplification.

BACKGROUND

Fifth-generation (5G) new radio (NR) (5G-NR) has been widely regarded as the next generation of wide-area wireless communication technology beyond the current third-generation (3G) and fourth-generation (4G) technologies. In this regard, a wireless communication device capable of supporting the 5G-NR wireless communication technology is expected to achieve higher data rates, improved coverage range, enhanced signaling efficiency, and reduced latency across a wide range of radio frequency (RF) bands, which include a low-band (below 1 GHz), a mid-band (1 GHz to 6 GHz), and a high-band (above 24 GHz). Moreover, the wireless communication device may still support the legacy 3G and 4G technologies for backward compatibility.

In addition, the wireless communication device is also required to support local area networking technologies, such as Wi-Fi, in both 2.4 GHz and 5 GHz bands. The latest 802.11ax standard has introduced a dynamic power control feature to allow the wireless communication device to transmit a Wi-Fi signal with a maximum power ranging from −10 dBm to 23 dBm. Accordingly, a Wi-Fi power amplifier(s) in the wireless communication device must be able to adapt a power level of the Wi-Fi signal on a per-frame basis. As a result, a power management circuit must be able to adapt an average power tracking (APT) voltage supplied to the Wi-Fi power amplifier(s) within Wi-Fi inter-frame spacing (IFS) to help maintain linearity and efficiency of the Wi-Fi power amplifier(s).

SUMMARY

Aspects disclosed in the detailed description include a power management circuit operable to adjust a voltage within a defined interval(s). The power management circuit is configured to generate a time-variant voltage for amplifying an analog signal based on a target voltage. In embodiments disclosed herein, the power management circuit can be configured to generate a lower initial target voltage at a start of the defined interval(s), such as during a cyclic prefix (CP) of an orthogonal frequency division multiplexing (OFDM) symbol, and dynamically adjust the initial target voltage, if necessary, within the defined interval(s) based on a time-variant power envelope of the analog signal. By generating the lower target voltage, in contrast to a conventional method of generating a maximum target voltage, at the start of the defined interval(s), it is possible to reduce energy waste and help improve efficiency in a power amplifier configured to amplify the analog signal based on the time-variant voltage.

In one aspect, a power management circuit is provided. The power management circuit includes a target voltage circuit. The target voltage circuit is configured to generate a target voltage at a start of each of a number of defined intervals for generating a time-variant voltage during each of the number of defined intervals to amplify an analog signal. The target voltage circuit is also configured to determine, based on a detected time-variant power envelope of the analog signal, whether to change the target voltage during each of the number of defined intervals. The target voltage circuit is also configured to adjust the target voltage after the start of each of the number of defined intervals in response to determining to change the target voltage.

In another aspect, a power management circuit is provided. The power management circuit includes a target voltage circuit. The target voltage circuit is configured to generate a target voltage at a start of each of a number of defined intervals for generating a time-variant voltage during each of the number of defined intervals to amplify an analog signal. The target voltage circuit is also configured to determine, based on a detected time-variant power envelope of the analog signal, whether to change the target voltage during each of the number of defined intervals. The target voltage circuit is also configured to adjust the target voltage after the start of each of the number of defined intervals in response to determining to change the target voltage. The power management circuit also includes a power management integrated circuit (PMIC) configured to generate the time-variant voltage based on the target voltage in each of the number of defined intervals.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1A:
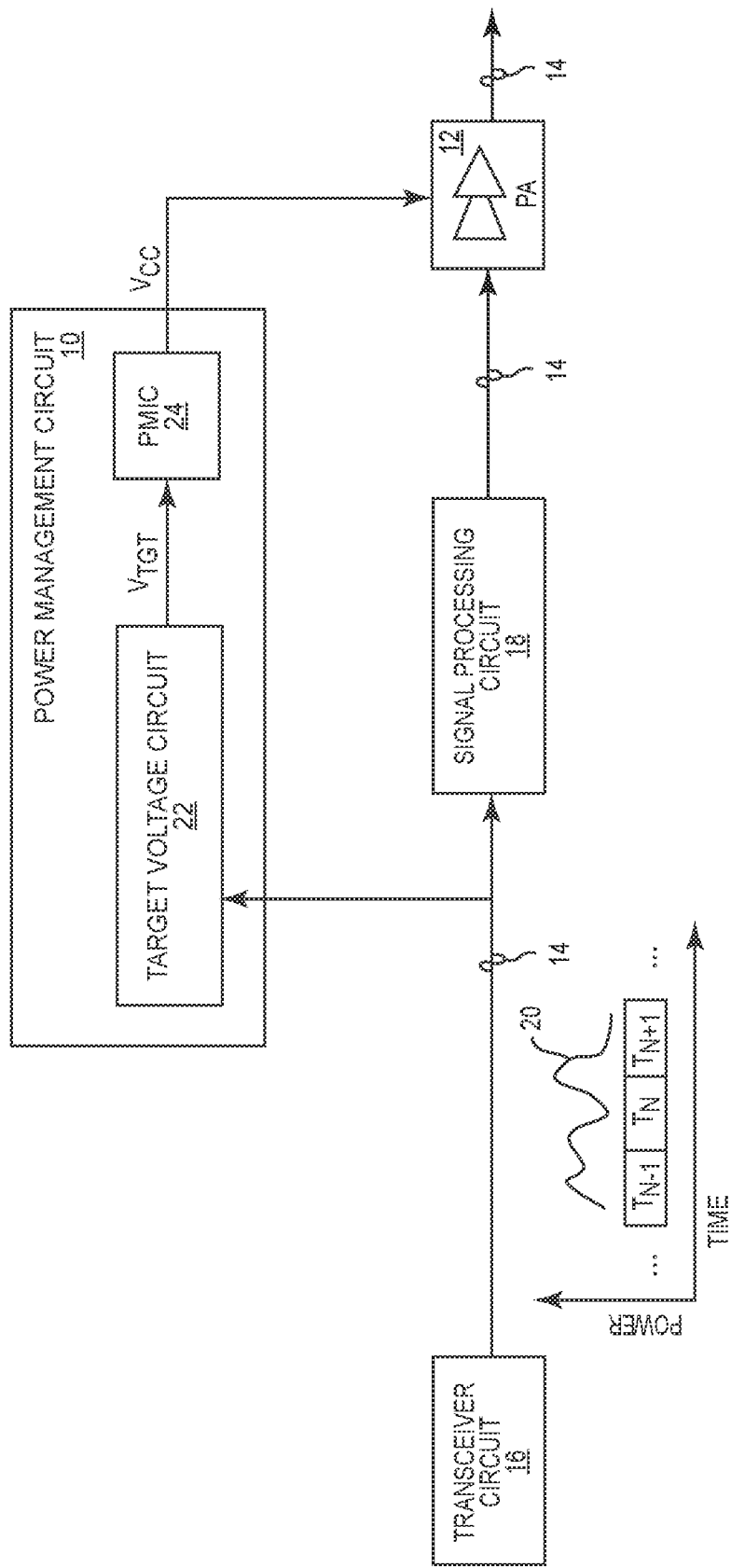
FIG. 1A is a schematic diagram of an exemplary existing power management circuit.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a power management circuit operable to adjust a voltage within a defined interval(s). The power management circuit is configured to generate a time-variant voltage for amplifying an analog signal based on a target voltage. In embodiments disclosed herein, the power management circuit can be configured to generate a lower initial target voltage at a start of the defined interval(s), such as during a cyclic prefix (CP) of an orthogonal frequency division multiplexing (OFDM) symbol, and dynamically adjust the initial target voltage, if necessary, within the defined interval(s) based on a time-variant power envelope of the analog signal. By generating the lower target voltage, in contrast to a conventional method of generating a maximum target voltage, at the start of the defined interval(s), it is possible to reduce energy waste and help improve efficiency in a power amplifier configured to amplify the analog signal based on the time-variant voltage.

Figure 1B:
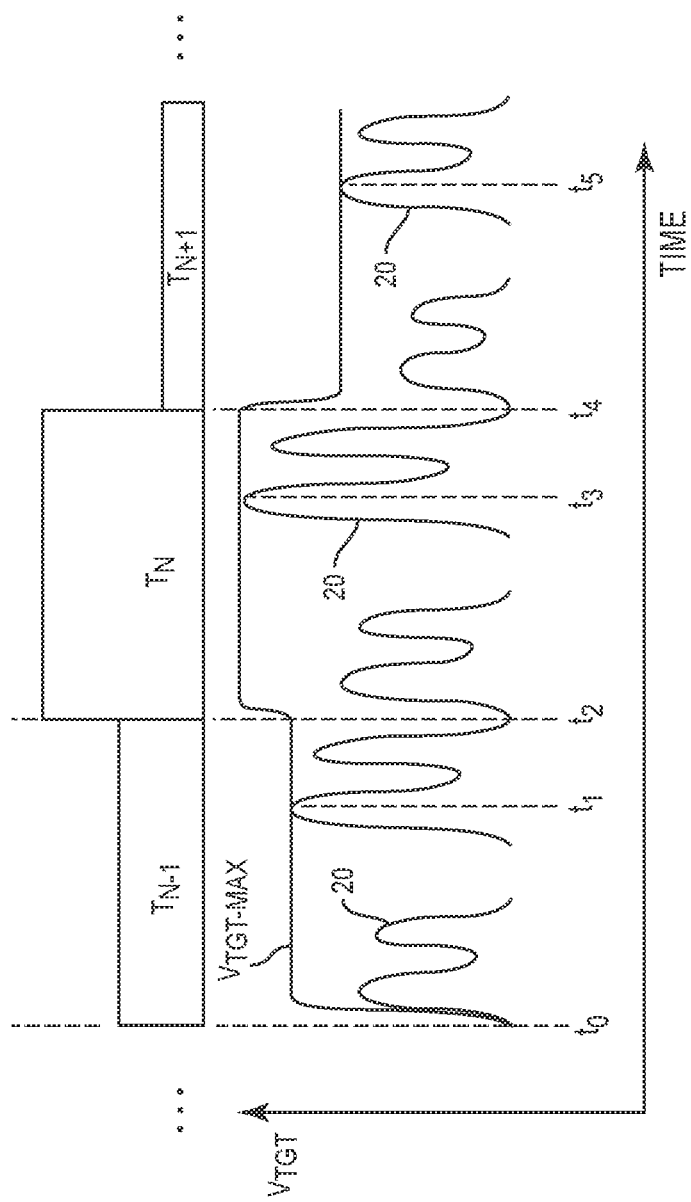
FIG. 1B is a graphic diagram providing an exemplary illustration of a target voltage(s) generated by the existing power management circuit of FIG. 1A in a defined interval(s)
Figure 2:
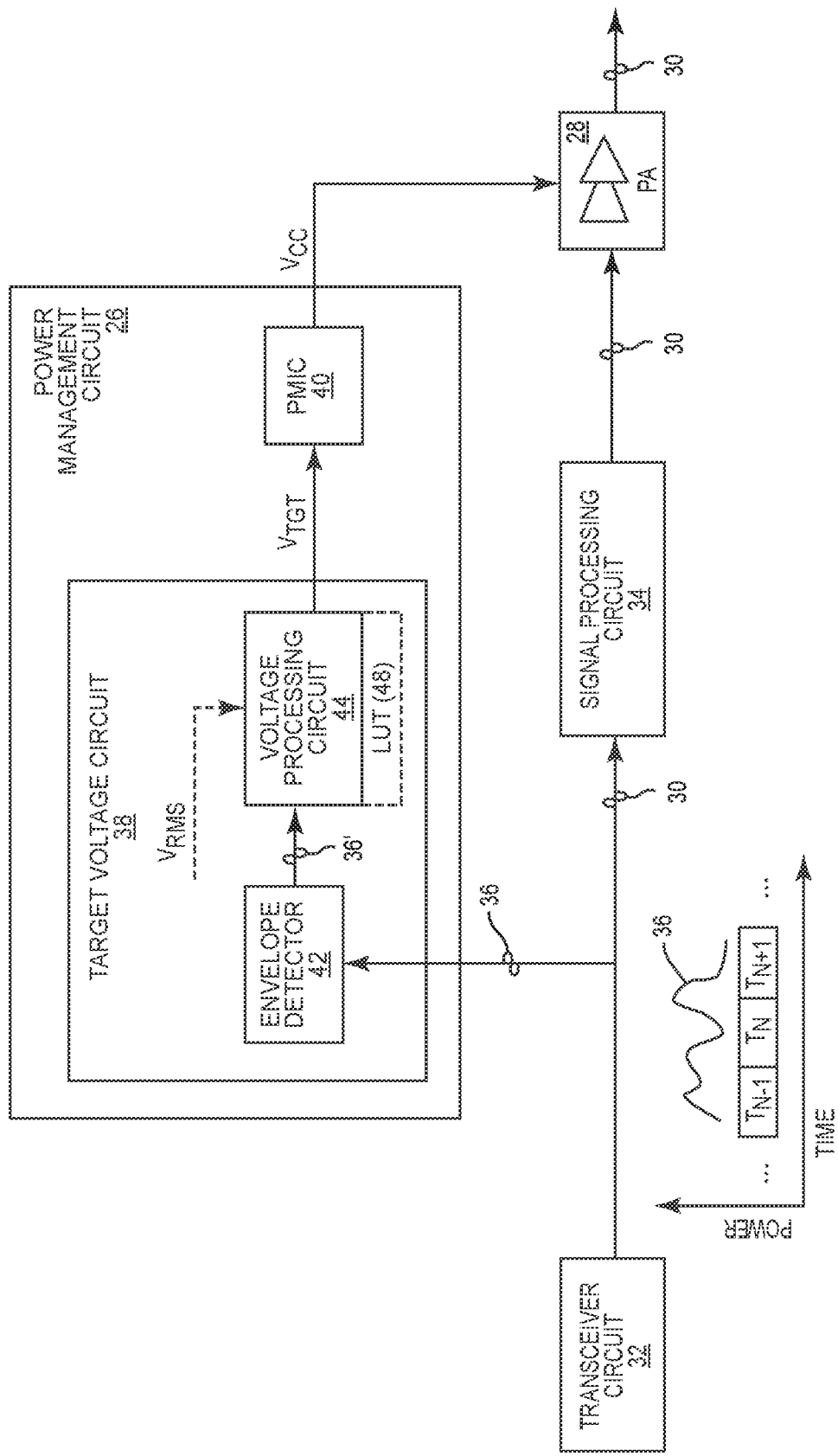
FIG. 2 is a schematic diagram of an exemplary power management circuit configured according to embodiments of the present disclosure to dynamically adjust a target voltage(s) during a defined interval(s) when determined as necessary.

Before discussing a power management circuit of the present disclosure, starting at FIG. 2, a brief overview of an existing power management that generates an initial target voltage based on a maximum target voltage as expected in a defined interval(s) is first provided with reference to FIGS. 1A-1B.

FIG. 1A is a schematic diagram of an exemplary existing power management circuit 10. The existing power management circuit 10 is configured to provide a time-variant voltage $V_{CC}$ to a power amplifier 12 for amplifying an analog signal 14. The analog signal 14 may be generated by a transceiver circuit 16 and provided to a signal processing circuit 18 in an intermediate frequency (IF). The signal processing circuit 18 may upconvert the analog signal 14 from the IF to a carrier frequency and provide the analog signal 14 to the power amplifier 12 for amplification.

The analog signal 14 is associated with a time-variant power envelope 20 that rises and falls over multiple defined intervals, such as the defined intervals $T_{N-1}$, $T_N$, $T_{N+1}$ as shown. Thus, to prevent potential amplitude distortion in the analog signal 14 and ensure higher operating efficiency of the power amplifier 12, the time-variant voltage $V_{CC}$ needs to closely track (rises and falls) the time-variant power envelope 20 across the defined intervals $T_{N-1}$, $T_N$, $T_{N+1}$.

As such, the existing power management circuit 10 is configured to include a target voltage circuit 22 and a power management integrated circuit (PMIC) 24. The target voltage circuit 22 is configured to detect the time-variant power envelope 20 of the analog signal 14 and generate a target voltage $V_{TGT}$ based on the detected time-variant power envelope 20. The PMIC 24, in turn, generates the time-variant voltage $V_{CC}$ based on the target voltage $V_{TGT}$.

FIG. 1B is a graphic diagram providing an exemplary illustration of the target voltage $V_{TGT}$ generated by the existing power management circuit 10 of FIG. 1A in the defined intervals $T_{N-1}$, $T_N$, $T_{N+1}$. Common elements between FIGS. 1A and 1B are shown therein with common element numbers and will not be re-described herein.

As shown in FIG. 1B, the existing power management circuit 10 generates the target voltage $V_{TGT}$ at a start of each of the defined intervals $T_{N-1}$, $T_N$, $T_{N+1}$ based on a maximum target voltage $V_{TGT-MAX}$ corresponding to a peak of the time-variant power envelope 20 in a respective one of the defined intervals $T_{N-1}$, $T_N$, $T_{N+1}$. In addition, the existing power management circuit 10 is configured to keep the target voltage $V_{TGT}$ constant in each of the defined intervals $T_{N-1}$, $T_N$, $T_{N+1}$.

For example, the existing power management circuit 10 generates the target voltage $V_{TGT}$ for the defined interval $T_{N-1}$ at the start time $t_0$ of the defined interval $T_{N-1}$ based on a peak of the time-variant power envelope 20 at time $t_1$, and keeps the target voltage $V_{TGT}$ constant until the start time $t_2$ of the defined interval $T_N$. At time $t_2$, the existing power management circuit 10 generates the target voltage $V_{TGT}$ for the defined interval $T_N$ based on a peak of the time-variant power envelope 20 at time $t_3$ and keeps the target voltage $V_{TGT}$ constant until the start time $t_4$ of the defined interval $T_{N+1}$. At time $t_4$, the existing power management circuit 10 generates the target voltage $V_{TGT}$ for the defined interval $T_{N+1}$ based on a peak of the time-variant power envelope 20 at time $t_5$ and keeps the target voltage $V_{TGT}$ constant until the end of the defined interval $T_{N+1}$.

However, as shown in FIG. 1B, the target voltage $V_{TGT}$ generated by the existing power management circuit 10 is higher than actually needed from time $t_0$ to $t_1$, $t_2$ to $t_3$, and $t_4$ to $t_5$. Accordingly, the PMIC 24 will generate the time-variant voltage $V_{CC}$ higher than what is needed for amplifying the analog signal 14 in accordance with the time-variant power envelope 20. Notably, the excessive time-variant voltage $V_{CC}$ generated by the PMIC 24 can lead to energy waste and reduce operating efficiency of the power amplifier 12. As such, it is desirable to optimize target voltage generation in the existing power management circuit 10 to help reduce energy waste and improve operating efficiency of the power amplifier 12.

In this regard, FIG. 2 is a schematic diagram of an exemplary power management circuit 26 configured according to embodiments of the present disclosure to dynamically adjust a target voltage $V_{TGT}$ during each of a number of defined intervals $T_{N-1}$, $T_N$, $T_{N+1}$ when determined as necessary. In examples discussed herein, the defined intervals $T_{N-1}$, $T_N$, $T_{N+1}$ each corresponds to a respective one of a number of orthogonal time division multiplexing (OFDM) symbols. However, it should be appreciated that the defined intervals $T_{N-1}$, $T_N$, $T_{N+1}$ can correspond to different time intervals, such as time slot, mini time slot, and so on. Further, the defined intervals $T_{N-1}$, $T_N$, $T_{N+1}$ as illustrated herein are merely examples to help explain the embodiments of the present disclosure. It should be understood that the embodiments described with reference to the defined intervals $T_{N-1}$, $T_N$, $T_{N+1}$ are applicable to an unlimited number of defined intervals.

The power management circuit 26 is configured to provide a time-variant voltage $V_{CC}$ to a power amplifier 28 for amplifying an analog signal 30. The analog signal 30 may be generated by a transceiver circuit 32 and provided to a signal processing circuit 34 in an IF. The signal processing circuit 34 may upconvert the analog signal 30 from the IF to a carrier frequency and provide the analog signal 30 to the power amplifier 28 for amplification.

The analog signal 30 is associated with a time-variant power envelope 36 that rises and falls over the defined intervals $T_{N-1}$, $T_N$, $T_{N+1}$. Thus, to prevent potential amplitude distortion in the analog signal 30 and ensure higher operating efficiency of the power amplifier 28, it is necessary to generate the time-variant voltage $V_{CC}$ to closely track the time-variant power envelope 36 across the defined intervals $T_{N-1}$, $T_N$, $T_{N+1}$.

In this regard, the power management circuit 26 is configured to include a target voltage circuit 38 and a PMIC 40. The target voltage circuit 38 is configured to generate the target voltage $V_{TGT}$ to track the time-variant power envelope 36 of the analog signal 30. The PMIC 40 is configured to generate a time-variant voltage $V_{CC}$ based on the target voltage $V_{TGT}$. Since the target voltage $V_{TGT}$ is generated to track the time-variant power envelope 36, the time-variant voltage $V_{CC}$ will likewise track the time-variant power envelope 36. For details on how the PMIC 40 can generate the time-variant voltage $V_{CC}$ in a timely manner, please refer to U.S. patent application Ser. No. 17/217,654, entitled "POWER MANAGEMENT CIRCUIT FOR FAST AVERAGE POWER TRACKING VOLTAGE SWITCHING."

Figure 3A:
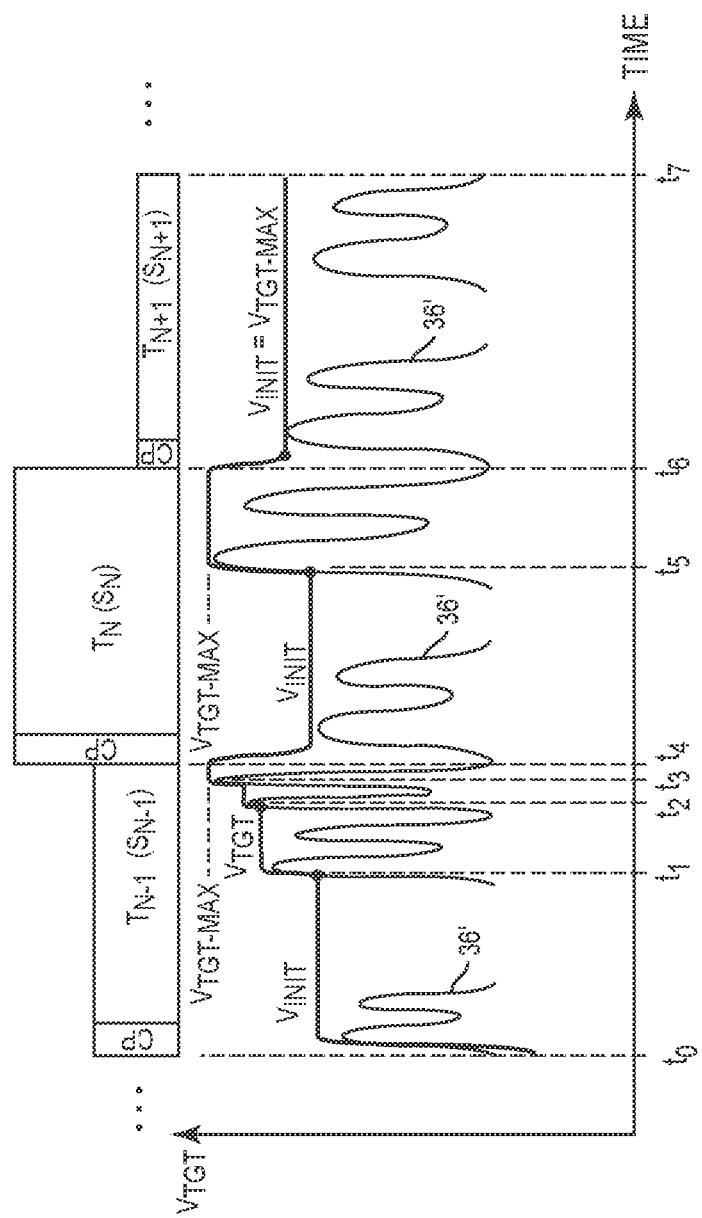
FIGS. 3A-3B are graphic diagrams providing exemplary illustrations as to how the power management circuit of FIG. 2 can be configured to dynamically adjust the target voltage(s) during the defined interval(s)

In contrast to the existing power management circuit 10 of FIG. 1A, which keeps the target voltage $V_{TGT}$ constant in each of the defined intervals $T_{N-1}$, $T_N$, $T_{N+1}$, the power management circuit 26 is configured to dynamically adjust the target voltage $V_{TGT}$ during each of the defined intervals $T_{N-1}$, $T_N$, $T_{N+1}$, when the power management circuit determines that such adjustment is necessary. In this regard, FIG. 3A is a graphic diagram providing an exemplary illustration as to how the power management circuit 26 of FIG. 2 can be configured to dynamically adjust the target voltage $V_{TGT}$ across the defined intervals $T_{N-1}$, $T_N$, $T_{N+1}$. Common elements between FIGS. 2 and 3A are shown therein with common element numbers and will not be re-described herein.

The target voltage circuit 38 is configured to generate the target voltage $V_{TGT}$ at a start of each of the defined intervals $T_{N-1}$, $T_N$, $T_{N+1}$. For the convenience of reference, the target voltage $V_{TGT}$ that generates at the start of each of the defined intervals $T_{N-1}$, $T_N$, $T_{N+1}$ is referred to interchangeably as an initial target voltage $V_{INIT}$. In a non-limiting example, the defined intervals $T_{N-1}$, $T_N$, $T_{N+1}$ each represents a respective one of multiple OFDM symbols $S_{N-1}$, $S_N$, $S_{N+1}$. As such, each of the OFDM symbols $S_{N-1}$, $S_N$, $S_{N+1}$ begins with a respective cyclic prefix (CP). Accordingly, the target voltage circuit 38 is said to generate the initial target voltage $V_{INIT}$ at the start of the defined intervals $T_{N-1}$, $T_N$, $T_{N+1}$, it means that the target voltage circuit 38 generates the initial target voltage $V_{INIT}$ during the CP of each of the OFDM symbols $S_{N-1}$, $S_N$, $S_{N+1}$.

In contrast to the target voltage circuit 22 in the existing power management circuit 10 of FIG. 1A, the target voltage circuit 38 does not always generate the initial target voltage $V_{INIT}$ based on the maximum target voltage $V_{TGT-MAX}$ in each of the defined intervals $T_{N-1}$, $T_N$, $T_{N+1}$. Instead, the target voltage circuit 38 can be configured to opportunistically generate the initial target voltage $V_{INIT}$ lower than the maximum target voltage $V_{TGT-MAX}$ in each of the defined intervals $T_{N-1}$, $T_N$, $T_{N+1}$. As such, the target voltage circuit 38 is further configured to determine, based on a detected time-variant power envelope 36', whether it is necessary to increase the initial target voltage $V_{INIT}$ during each of the defined intervals $T_{N-1}$, $T_N$, $T_{N+1}$. If the target voltage circuit 38 determines that it is necessary to change the initial target voltage $V_{INIT}$ during any of the defined intervals $T_{N-1}$, $T_N$, $T_{N+1}$, the target voltage circuit 38 will raise the initial target voltage $V_{INIT}$ to a higher level after the start (e.g., after the CP) of the defined intervals $T_{N-1}$, $T_N$, and/or $T_{N+1}$. If the target voltage circuit 38 determines that it is not necessary to change the initial target voltage $V_{INIT}$ during any of the defined intervals $T_{N-1}$, $T_N$, $T_{N+1}$, the target voltage circuit 38 will maintain the initial target voltage $V_{INIT}$ in the defined intervals $T_{N-1}$, $T_N$, and/or $T_{N+1}$.

For example, in the defined interval $T_{N-1}$ that starts at time $t_0$, the peak of the detected time-variant power envelope 36' will not occur until time $t_3$. As such, the target voltage circuit 38 can opportunistically generate the initial target voltage $V_{INIT}$ at time $t_0$ be lower than the maximum target voltage $V_{TGT-MAX}$ associated with the peak of the detected time-variant power envelope 36'. At or prior to time $t_1$, the target voltage circuit 38 determines, based on the detected time-variant power envelope 36', it is necessary to increase the initial target voltage $V_{INIT}$. Accordingly, the target voltage circuit 38 increases the initial target voltage $V_{INIT}$ to the target voltage $V_{TGT}$ that is still below the maximum target voltage $V_{TGT-MAX}$. At or prior to time $t_2$, the target voltage circuit 38 determines, based on the detected time-variant power envelope 36', it is necessary to increase the target voltage $V_{TGT}$ again and increases the target voltage $V_{TGT}$ accordingly. At or prior to time $t_3$, the target voltage circuit 38 determines, based on the detected time-variant power envelope 36', it is necessary to increase the target voltage $V_{TGT}$ to the maximum target voltage $V_{TGT-MAX}$ and increases the target voltage $V_{TGT}$ accordingly. Thereafter, the target voltage circuit 38 maintains the target voltage $V_{TGT}$ at the maximum target voltage $V_{TGT-MAX}$ for the remainder of the defined interval $T_{N-1}$, until the defined interval $T_N$ starts at time $t_4$.

In the defined interval $T_N$, the peak of the detected time-variant power envelope 36' will not occur until time $t_5$. As such, the target voltage circuit 38 can opportunistically generate the initial target voltage $V_{INIT}$ at time $t_4$ to be lower than the maximum target voltage $V_{TGT-MAX}$ associated with the peak of the detected time-variant power envelope 36'. At or prior to time $t_5$, the target voltage circuit 38 determines, based on the detected time-variant power envelope 36', it is necessary to increase the initial target voltage $V_{INIT}$ to the maximum target voltage $V_{TGT-MAX}$ and increases the initial target voltage $V_{INIT}$ accordingly. Thereafter, the target voltage circuit 38 maintains the target voltage $V_{TGT}$ at the maximum target voltage $V_{TGT-MAX}$ for the remainder of the defined interval $T_N$, until the defined interval $T_{N+1}$ starts at time $t_6$.

In the defined interval $T_{N+1}$, the peak of the detected time-variant power envelope 36' occurs at time $t_6$. As such, the target voltage circuit 38 will generate the initial target voltage $V_{INIT}$ to be equal to the maximum target voltage $V_{TGT-MAX}$ and maintains the initial target voltage $V_{INIT}$ at the maximum target voltage $V_{TGT-MAX}$ until time $t_7$.

Figure 3B:
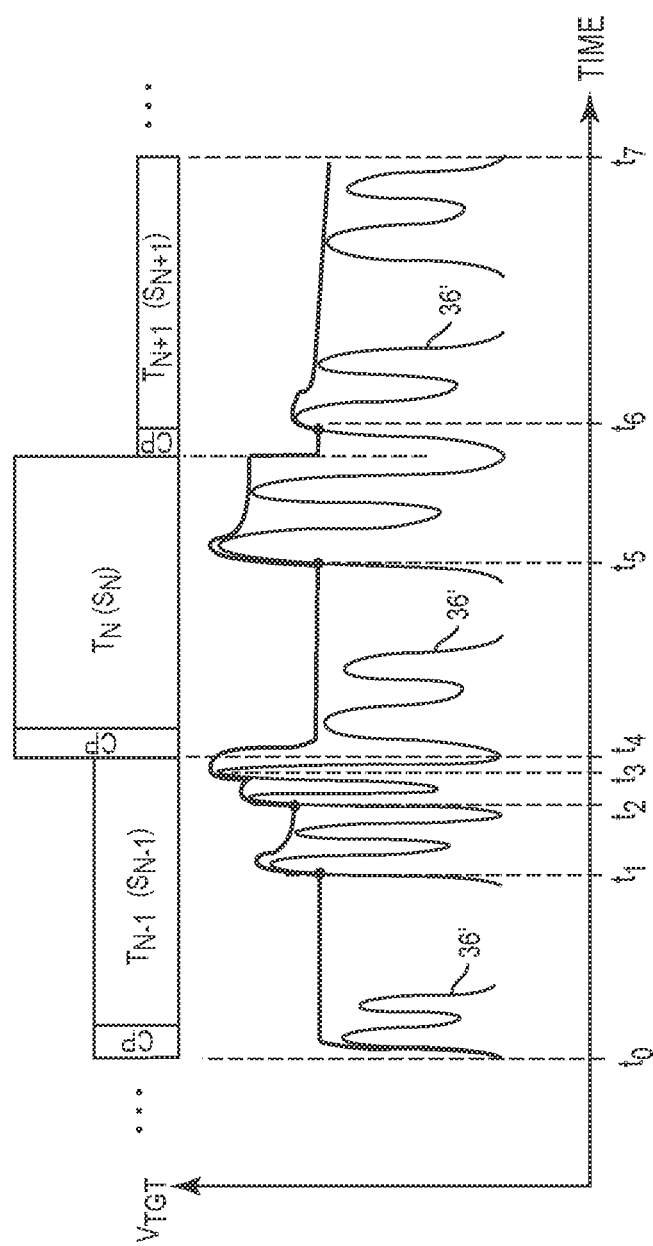

FIG. 3B is a graphic diagram providing another exemplary illustration as to how the power management circuit 26 of FIG. 2 can be configured to dynamically adjust the target voltage $V_{TGT}$ across the defined intervals $T_{N-1}$, $T_N$, $T_{N+1}$. Alternative to maintaining the target voltage $V_{TGT}$ after raising the target voltage $V_{TGT}$ at times $t_1$, $t_2$, $t_3$, $t_5$, and $t_6$, the target voltage circuit 38 allows the target voltage $V_{TGT}$ to decay at a defined rate.

With reference back to FIG. 2, in a non-limiting example, the target voltage circuit 38 includes an envelope detector circuit 42 and a voltage processing circuit 44. The envelope detector circuit 42 is configured to detect the time-variant power envelope 36 of the analog signal 30 and provides the detected time-variant power envelope 36' to the voltage processing circuit 44. The voltage processing circuit 44, which can be a field-programmable gate array (FPGA), as an example, is configured to generate the target voltage $V_{TGT}$ (a.k.a. the initial target voltage $V_{INIT}$) at the start of each of the defined intervals $T_{N-1}$, $T_N$, $T_{N+1}$. The voltage processing circuit 44 is also configured to determine, based on the detected time-variant power envelope 36' of the analog signal 30, whether to change the target voltage $V_{TGT}$ during each of the defined intervals $T_{N-1}$, $T_N$, $T_{N+1}$. Accordingly, the voltage processing circuit 44 can adjust the target voltage $V_{TGT}$ during each of the defined intervals $T_{N-1}$, $T_N$, $T_{N+1}$ in response to determining to change the target voltage $V_{TGT}$.

In one embodiment, the voltage processing circuit 44 can generate the target voltage $V_{TGT}$ (a.k.a. the initial target voltage $V_{INIT}$) at the start of each of the defined intervals $T_{N-1}$, $T_N$, $T_{N+1}$ to equal a root-mean-square (RMS) voltage $V_{RMS}$ determined for each of the defined intervals $T_{N-1}$, $T_N$, $T_{N+1}$. In a non-limiting example, the RMS voltage $V_{RMS}$ can be determined by the transceiver circuit 32 and provided to the voltage processing circuit 44 prior to the start of each of the defined intervals $T_{N-1}$, $T_N$, $T_{N+1}$. The transceiver circuit 32 may provide the RMS voltage $V_{RMS}$ to the voltage processing circuit 44 via a serial interface, such as radio frequency front-end (RFFE), or a parallel interface, such as general-purpose input output (GPIO). Accordingly, the voltage processing circuit 44 can generate the initial target voltage $V_{INIT}$ that equals the RMS voltage $V_{RMS}$ ($V_{INIT}=V_{RMS}$) at the start of each of the defined intervals $T_{N-1}$, $T_N$, $T_{N+1}$.

When the voltage processing circuit 44 determines to increase the target voltage $V_{TGT}$ during any of the defined intervals $T_{N-1}$, $T_N$, $T_{N+1}$ (e.g., at or prior to times $t_1$, $t_2$, $t_3$, and $t_5$ in FIGS. 3A and 3B), the voltage processing circuit 44 may be configured to increase the target voltage $V_{TGT}$ to a higher level $V_{TGT-NEW}$ as expressed in equation (Eq. 1) below.

$$V_{TGT-NEW} = V_{TGT} * 10^{(x/20)} \quad \text{(Eq. 1)}$$

In the equation (Eq. 1) above, $V_{TGT}$ represents the target voltage $V_{TGT}$ prior to being increased and x represents a peak-to-average ratio (PAR) of the target voltage $V_{TGT}$ in decibel (dB) term.

Figure 4:
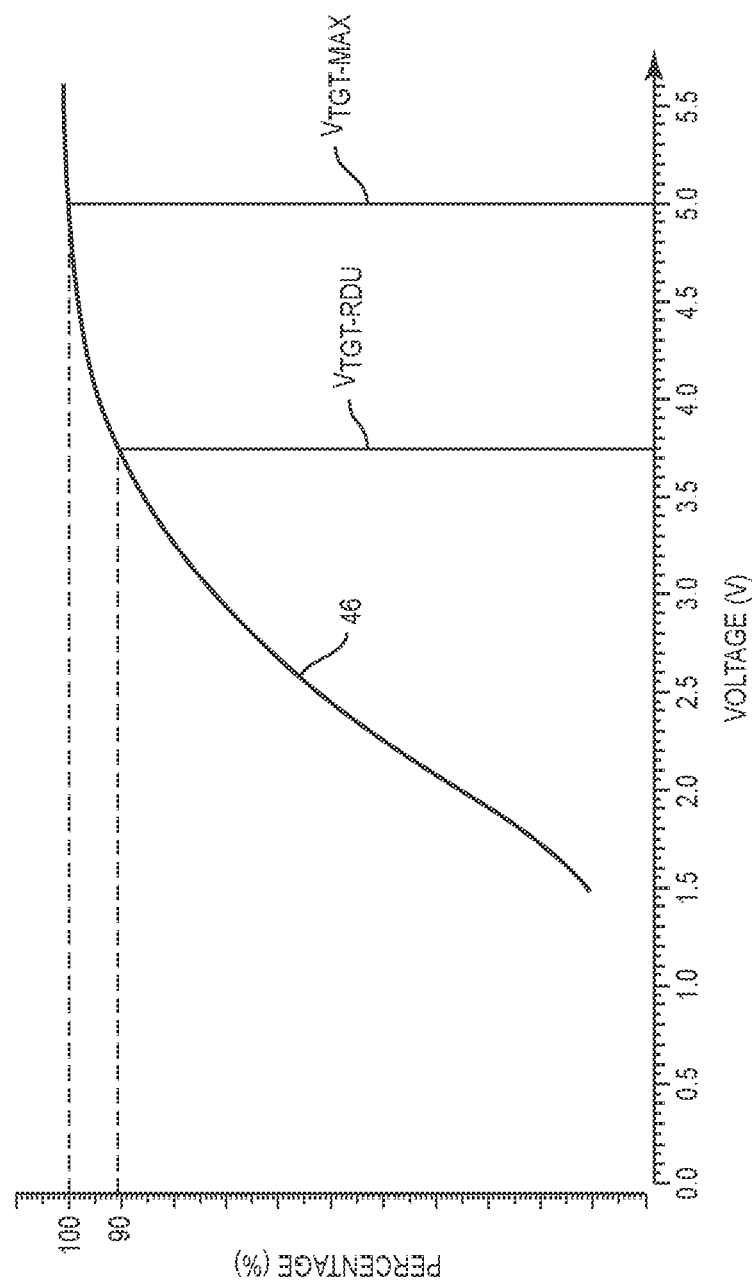
FIG. 4 is a graphic diagram providing an exemplary illustration of a statistical model that may be utilized by the power management circuit of FIG. 2 to determine the target voltage(s) at a start of the defined interval(s)

In another embodiment, the voltage processing circuit 44 can generate the target voltage $V_{TGT}$ (a.k.a. the initial target voltage $V_{INIT}$) at the start of each of the defined intervals $T_{N-1}$, $T_N$, $T_{N+1}$ to equal a reduced target voltage $V_{TGT-RDU}$ relative to the maximum target voltage $V_{TGT-MAX}$ in each of the defined intervals $T_{N-1}$, $T_N$, $T_{N+1}$. In a non-limiting example, as shown in FIG. 4, the voltage processing circuit 44 can determine the reduced target voltage $V_{TGT-RDU}$ based on a statistical model. In this regard, FIG. 4 is a graphic diagram providing an exemplary illustration of a statistical model that may be utilized by the target voltage circuit 38 in the power management circuit 26 of FIG. 2 to determine the target voltage $V_{TGT}$ at the start of each of the defined intervals $T_{N-1}$, $T_N$, $T_{N+1}$.

The statistical model shown in FIG. 4 includes a voltage-probability curve 46. According to the voltage-probability curve 46, if the maximum target voltage $V_{TGT-MAX}$ in each of the defined intervals $T_{N-1}$, $T_N$, $T_{N+1}$ corresponds to a 100% probability, then the reduced target voltage $V_{TGT-RDU}$ will be any voltage on the voltage-probability curve 46 with less than 100% probability. For example, if the maximum target voltage $V_{TGT-MAX}$ is 5 V, then the reduced target voltage $V_{TGT-RDU}$ with 90% probability is approximately 3.75 V. In this regard, the voltage processing circuit 44 may generate the target voltage $V_{TGT}$ (a.k.a. $V_{INIT}$) at the start of each of the defined intervals $T_{N-1}$, $T_N$, $T_{N+1}$ to equal 3.75 V.

Figure 5:
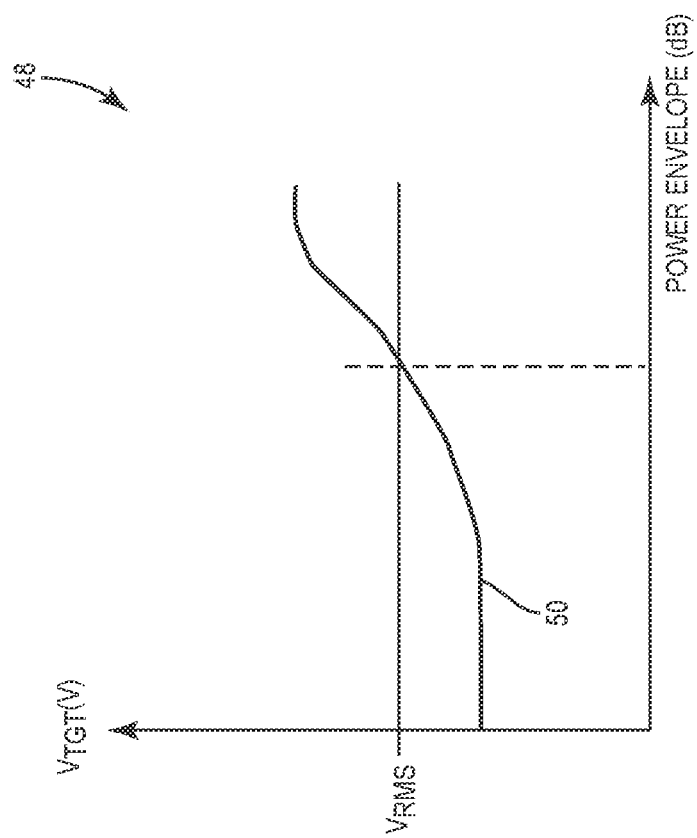
FIG. 5 is a graphic diagram providing an exemplary illustration of an analog lookup table (LUT) that can be employed by the power management circuit of FIG. 2 to increase the target voltage(s) from one level to another during the defined interval(s).

The voltage processing circuit 44 can be configured to increase the target voltage $V_{TGT}$ during any of the defined intervals $T_{N-1}$, $T_N$, $T_{N+1}$ based on an analog lookup table (LUT) 48. In this regard, FIG. 5 is a graphic diagram providing an exemplary illustration of the analog LUT 48 that can be employed by the voltage processing circuit 44 to increase the target voltage $V_{TGT}$ from one level to another during any of the defined intervals $T_{N-1}$, $T_N$, $T_{N+1}$.

In a non-limiting example, the analog LUT 48 includes an isogain curve 50 that correlates the detected time-variant power envelope 36' with the target voltage $V_{TGT}$. In this regard, the voltage processing circuit 44 may be configured to increase the target voltage $V_{TGT}$ to a higher level $V_{TGT-NEW}$ in accordance with the isogain curve 50 in the analog LUT 48.

In an alternative embodiment, the voltage processing circuit 44 may be configured to increase the target voltage $V_{TGT}$ to a higher level $V_{TGT-NEW}$ in accordance with the equation (Eq. 2) below.

$$V_{TGT-NEW} = \text{MAX}(V_{TGT-PREV}, V_{TGT-LUT}, V_{RMS}) \quad \text{(Eq. 2)}$$

In the equation (Eq. 2) above, $V_{TGT-PREV}$ represents a previous target voltage generated in a previous one of the defined intervals $T_{N-1}$, $T_N$, $T_{N+1}$ immediately preceding a present one of the defined intervals $T_{N-1}$, $T_N$, $T_{N+1}$. For example, if the present defined interval is $T_N$, then the $V_{TGT-PREV}$ represents the target voltage $V_{TGT}$ generated in the defined interval $T_{N-1}$. $V_{TGT-LUT}$ represents the target voltage $V_{TGT}$ generated in the present one of the defined intervals $T_{N-1}$, $T_N$, $T_{N+1}$ based on the analog LUT 48. $V_{RMS}$ represents the RMS voltage $V_{RMS}$ determined for each of the defined intervals $T_{N-1}$, $T_N$, $T_{N+1}$. Accordingly, the voltage processing circuit 44 can increase the target voltage $V_{TGT}$ to a highest one of the $V_{TGT-PREV}$, $V_{TGT-LUT}$, and $V_{RMS}$ in any of the defined intervals $T_{N-1}$, $T_N$, $T_{N+1}$.

Those skilled in the art will recognize improvements and modifications to the embodiments of the present disclosure. All such improvements and modifications are considered within the scope of the concepts disclosed herein and the claims that follow.

What is claimed is:

1. A power management circuit comprising:
   a target voltage circuit configured to:
   generate a target voltage during a cyclic prefix (CP) in each of a plurality of defined intervals for generating a time-variant voltage during each of the plurality of defined intervals to amplify an analog signal, wherein the plurality of defined intervals each corresponds to a respective one of a plurality of orthogonal frequency division multiplexing (OFDM) symbols comprising the CP;
   determine, based on a detected time-variant power envelope of the analog signal, whether to change the target voltage during each of the plurality of defined intervals; and
   adjust the target voltage after the CP of each of the plurality of OFDM symbols in response to determining to change the target voltage.

2. The power management circuit of claim 1 wherein the target voltage circuit is further configured to maintain the target voltage during each of the plurality of defined intervals in response to determining not to change the target voltage during each of the plurality of defined intervals.

3. The power management circuit of claim 1 further comprising a power management integrated circuit (PMIC) configured to generate the time-variant voltage in each of the plurality of defined intervals based on the target voltage.

4. The power management circuit of claim 1 wherein the target voltage circuit comprises a voltage processing circuit configured to:
   generate the target voltage at the start of each of the plurality of defined intervals;
   determine, based on the detected time-variant power envelope of the analog signal, whether to change the target voltage during each of the plurality of defined intervals; and
   adjust the target voltage during each of the plurality of defined intervals in response to determining to change the target voltage.

5. The power management circuit of claim 4 wherein the target voltage circuit further comprises an envelope detector circuit configured to detect a time-variant power envelope of the analog signal and provide the detected time-variant power envelope to the voltage processing circuit.

6. The power management circuit of claim 4 wherein the voltage processing circuit is further configured to:
   determine, based on the detected time-variant power envelope of the analog signal, whether to increase the target voltage during each of the plurality of defined intervals; and
   adjust the target voltage to a higher level during each of the plurality of defined intervals in response to determining to increase the target voltage.

7. The power management circuit of claim 6 wherein the voltage processing circuit is further configured to maintain the target voltage at the higher level during each of the plurality of defined intervals.

8. The power management circuit of claim 6 wherein the voltage processing circuit is further configured to decay the target voltage from the higher level at a defined rate during each of the plurality of defined intervals.

9. The power management circuit of claim 6 wherein the target voltage generated at the start of each of the plurality of defined intervals is equal to a root-mean-square (RMS) voltage in each of the plurality of defined intervals.

10. The power management circuit of claim 9 wherein the voltage processing circuit is further configured to receive the RMS voltage prior to the start of each of the plurality of defined intervals.

11. The power management circuit of claim 9 wherein, in response to determining to increase the target voltage, the voltage processing circuit is further configured to increase the target voltage to the higher level that equals $V_{TGT}*10^{(x/20)}$ wherein:
    $V_{TGT}$ represents the target voltage prior to being increased; and
    x represents a peak-to-average ratio (PAR) of the target voltage in decibel (dB) term.

12. The power management circuit of claim 6 wherein the target voltage generated at the start of each of the plurality of defined intervals is equal to a reduced target voltage relative to a maximum target voltage in each of the plurality of defined intervals.

13. The power management circuit of claim 12 wherein the voltage processing circuit is further configured to determine the reduced target voltage in each of the plurality of defined intervals based on a statistical model.

14. The power management circuit of claim 12 wherein, in response to determining to increase the target voltage, the voltage processing circuit is further configured to increase the target voltage to the higher level based on an analog lookup table (LUT).

15. The power management circuit of claim 6 wherein, in response to determining to increase the target voltage in each of the plurality of defined intervals, the voltage processing circuit is further configured to adjust the target voltage to the higher level that equals a highest one of:
    a previous target voltage generated in a previous one of the plurality of defined intervals immediately preceding a present one of the plurality of defined intervals;
    the target voltage generated in the present one of the plurality of defined intervals; and
    a root-to-mean-square (RMS) voltage received prior to the start of the present one of the plurality of defined intervals.

16. A power management circuit comprising:
    a target voltage circuit configured to:
    generate a target voltage during a cyclic prefix (CP) in each of a plurality of defined intervals for generating a time-variant voltage during each of the plurality of defined intervals to amplify an analog signal wherein the plurality of defined intervals each corresponds to a respective one of a plurality of orthogonal frequency division multiplexing (OFDM) symbols comprising the CP;

determine, based on a detected time-variant power envelope of the analog signal, whether to change the target voltage during each of the plurality of defined intervals; and adjust the target voltage after the CP of each of the plurality of OFDM symbols in response to determining to change the target voltage; and a power management integrated circuit (PMIC) configured to generate the time-variant voltage based on the target voltage in each of the plurality of defined intervals.

17. The power management circuit of claim 16 wherein the target voltage circuit comprises a voltage processing circuit configured to:
- generate the target voltage at the start of each of the plurality of defined intervals;
- determine, based on the detected time-variant power envelope of the analog signal, whether to change the target voltage during each of the plurality of defined intervals; and
- adjust the target voltage during each of the plurality of defined intervals in response to determining to change the target voltage.

18. The power management circuit of claim 17 wherein the target voltage circuit further comprises an envelope detector circuit configured to detect a time-variant power envelope of the analog signal and provide the detected time-variant power envelope to the voltage processing circuit.

* * * * *